(12) United States Patent
Yamane et al.

(10) Patent No.: US 7,192,851 B2
(45) Date of Patent: Mar. 20, 2007

(54) SEMICONDUCTOR LASER MANUFACTURING METHOD

(75) Inventors: Keiji Yamane, Akou (JP); Tetsuo Ueda, Okayama (JP); Isao Kidoguchi, Kawanishi (JP); Toshiya Kawata, Okayama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 308 days.

(21) Appl. No.: 10/931,206

(22) Filed: Sep. 1, 2004

(65) Prior Publication Data

US 2005/0059181 A1   Mar. 17, 2005

(30) Foreign Application Priority Data

Sep. 1, 2003   (JP) ............................. 2003-309319

(51) Int. Cl.
*H01L 21/00* (2006.01)
(52) U.S. Cl. ...................... 438/485; 438/474; 438/475; 257/631; 257/640; 372/49.01
(58) Field of Classification Search ........ 438/474–475, 438/485; 257/631–646; 372/49.01
See application file for complete search history.

(56) References Cited

U.S. PATENT DOCUMENTS 5,022,977 A * 6/1991 Matsuoka et al. ..... 204/298.16
6,067,310 A * 5/2000 Hashimoto et al. ...... 372/49.01
6,096,176 A * 8/2000 Horiike et al. ......... 204/192.17
6,618,409 B1 * 9/2003 Hu et al. .................. 372/43.01
6,985,504 B2 * 1/2006 Ueda et al. ............... 372/43.01
2001/0015438 A1 * 8/2001 Callegari et al. ............. 257/40
2004/0206308 A1 * 10/2004 Ahn et al. ............ 118/723 MP

FOREIGN PATENT DOCUMENTS

JP          09-148676 A     6/1997

* cited by examiner

*Primary Examiner*—Thao X. Le
*Assistant Examiner*—Abul Kalam
(74) *Attorney, Agent, or Firm*—McDermott Will & Emery LLP

(57) ABSTRACT

A method for manufacturing a semiconductor laser. As a preparative step for coating an end face of a resonator with a dielectric film, a cleavage plane of a semiconductor laminated structure that is to be the end face is subjected to a plasma cleaning to prevent a conductive film, which absorbs laser light, from attaching to the cleavage plane. During the plasma cleaning, a first process gas containing argon gas and nitrogen gas is introduced into a vacuumed ECR sputtering apparatus. After the cleavage plane is exposed to the first process gas in the plasma state for a certain time period without application of a voltage, a second process gas containing argon gas and oxygen gas is introduced, and the cleavage plane is exposed to the second process gas in the plasma state while a voltage is applied to the silicon target.

10 Claims, 20 Drawing Sheets

180

SEMICONDUCTOR LASER MANUFACTURING METHOD

BACKGROUND OF THE INVENTION (1) Field of the Invention

The present invention relates to a semiconductor laser manufacturing method, and in particular to a technology for preventing the COD (Catastrophic Optical Damage) level from being lowered.

(2) Description of the Related Art

In manufacturing high-output semiconductor lasers, what is called an asymmetric coating is generally adopted to coat end faces of a resonator.

With the asymmetric coating, a low reflecting coating is formed on an end face of the resonator through which laser beams are emitted, and a high reflecting coating is formed on the other end face of the resonator, for the purpose of emitting laser beams efficiently.

In a preparative stage for the asymmetric coating, what is called a plasma cleaning is performed to expose cleavage planes of a semiconductor laminated structure, which are to be the end faces of the resonator, to inert gas (such as argon gas) in plasma state for several minutes. This removes from the cleavage planes substances that had been floating in the air before attaching to the cleavage planes when the semiconductor laminated structure was cleaved in the air. Dirty cleavage planes decrease the degree of contact of the coating. It is therefore desirable that the cleavage planes are clean enough.

Meanwhile, the inventors of the present invention found through experiments that with conventional technologies for plasma cleaning, the Catastrophic Optical Damage (COD) level is lowered with the extension of the duration of the plasma cleaning.

It should be noted here that the COD indicates a phenomenon in which the heat of laser light emitted from an end face of a resonator of a semiconductor laser is absorbed into the end face of the resonator to destroy the end face, and that the COD level indicates the lowest output value of the laser light at which the COD is generated.

The following describes the experiments conducted by the inventors of the present invention.

First prepared were a GaAs substrate, which is the experimental sample, and an Electron Cyclotron Resonance (hereinafter ECR) sputtering apparatus.

FIG. 19 is a cross-sectional view of the ECR sputtering apparatus.

In FIG. 19, the ECR sputtering apparatus 5 includes: a plasma chamber 64 in which an ECR plasma gas is generated; a coating forming chamber 60; a silicon target 61 having degree of purity not lower than 5N; and coils 66 provided around the plasma chamber 64 to form magnetic fields.

In the plasma chamber 64, a micro wave, which is introduced into the chamber through a quartz window, and magnetic fields formed by the coils 66 put a process gas, which is introduced into the chamber through a gas introduction pipe 67, into the ECR plasma state.

The silicon target 61, which is connected to an RF power supply 65, controls the sputtering yield by changing the applying voltage in largeness.

The coating forming chamber 60 is connected to an exhaust system (not illustrated) via an exhaust opening 68. With this construction, it is possible to reduce the pressure in the coating forming chamber 60.

A sample board 62 with a GaAs substrate 63 set thereon is placed in the coating forming chamber 60 to form a coating on the GaAs substrate 63. In this case, the amount of energy of the process gas in the plasma state that reaches the surface of the GaAs substrate 63 is determined by the ECR divergence magnetic field distribution.

For example, when the sample board 62 is 20 cm away from the ECR point, the amount of energy of the process gas in the plasma state is approximately 10–20 eV. It should be noted here that these values are obtained when no voltage is applied to the sample board 62.

The samples were subjected to experiments under the conditions (i) and (ii) shown in Table 1, respectively.

TABLE 1

| Conditions | Plasma cleaning gas | Plasma cleaning duration |
| --- | --- | --- |
| (i) | No plasma cleaning (reference) | |
| (ii) | Argon gas (30 sccm) | 10 minutes |

The plasma cleaning was performed under conditions (ii) as follows.

(1) The internal pressure during the gas introduction was approximately $10^{-1}$ Pa. The strength of the micro wave was approximately 600 W.

(2) To restrict the amount of the sputtering occurring at the silicon target 61 to as small a degree as possible, no voltage was applied to the silicon target, and the sample board 62 was set to a normal temperature.

(3) After the plasma cleaning, the samples were extracted from the ECR sputtering apparatus 5, without forming coatings on the samples.

The surfaces of the GaAs substrates of the samples for each of the conditions (i) and (ii) were analyzed using the Auger electron spectroscopy. The following Table 2 shows the results of the analysis.

TABLE 2

| Conditions | Plasma cleaning gas | Detected elements |
| --- | --- | --- |
| (i) | No plasma cleaning | Carbon, oxygen |
| (ii) | Argon gas (30 sccm) | Silicon, oxygen |

The analysis results shown in Table 2 provide the following findings.

(1) Carbon was detected on the surface of the GaAs substrate 63 of the samples that were not subjected to a plasma cleaning (condition (i)). This shows the effect of the plasma cleaning since carbon was not found from the samples that were subjected to the plasma cleaning.

(2) Silicon was detected on the surface of the GaAs substrate 63 of the samples that were subjected to the plasma cleaning using only the argon gas (condition (ii)). This shows that a silicon film is formed on the surface of the GaAs substrate 63. The amount of the silicon film, when converted from the thickness of the coating, is presumed to be approximately 10 Å. That is to say, it is estimated that a silicon film of approximately 10 Å is formed on an end face of the resonator for a semiconductor laser when a conventional plasma cleaning is performed under the condition (ii). This means that after the coating is formed later, the silicon film remains between the coating and the end face of the resonator.

It is estimated that the silicon film is provided from the silicon target 61. Until this experiment was conducted, it had been considered that the sputtering is caused only when a negative voltage of not lower than 100V is applied to the silicon target 61. It was confirmed through this experiment, however, that a small amount of sputtering occurs at the surface of the silicon target 61 during a plasma cleaning.

It is considered that this phenomenon occurs for the following reason. As shown in FIG. 20, after a plasma discharge starts, a potential of approximately −5V to −10V is generated as the sheath potential of plasma. This causes a potential difference on the surface of the silicon target 61.

Ions in the process gas in the plasma state are drawn toward and collide with the silicon target 61. This causes the sputtering at the surface of the silicon target 61, allowing ions of silicon to emit from the silicon target 61. The ions of silicon reach the sample (GaAs substrate 63) and are heaped up on the surface thereof.

The silicon film, which is presumed to be formed as described above, is considered to be a significant factor in lowering the COD level. This is because, for example, when an amorphous silicon film is formed on an end face of the resonator of an AlGaInP base semiconductor laser, the amorphous silicon film absorbs the light having the laser emission wavelength (630–680 nm).

SUMMARY OF THE INVENTION

The object of the present invention is therefore to provide a semiconductor laser manufacturing method for preventing the plasma cleaning from lowering the COD level.

The above object is fulfilled by a semiconductor laser manufacturing method for manufacturing a semiconductor laser by cleaning a cleavage plane of a semiconductor laminated structure by a plasma cleaning using a sputtering apparatus, the cleavage plane being to be an end face of a resonator, the method comprising: a first step of placing the semiconductor laminated structure with the cleavage plane in the sputtering apparatus; a second step of introducing a process gas containing a reactive gas and an inert gas into the sputtering apparatus, and then putting the process gas into a plasma state; and a third step of exposing a target material and the cleavage plane to the process gas in the plasma state while no voltage is applied to the target material, causing a reaction of the target material and the reactive gas to form a compound that reflects light of a predetermined wavelength so that a film of the compound is formed on the cleavage plane.

With the above-stated semiconductor laser manufacturing method, during the plasma cleaning, a compound that reflects light of a predetermined wavelength is formed by a reaction of the target material and the reactive gas, and the formed compound is heaped up on a cleavage plane that is to be an end face of the resonator of the semiconductor laser, while the cleavage plane is cleaned. This suppresses the lowering of the COD level.

The above-described semiconductor laser manufacturing method may further comprise: a fourth step of, after the third step, putting a second process gas containing an oxygen gas and an inert gas into a plasma state; and a fifth step of exposing the target material and the cleavage plane to the second process gas in the plasma state while a voltage is applied to the target material, causing a reaction of the target material and the oxygen gas to form an oxide so that a film of the oxide is formed on the cleavage plane.

With the above-stated semiconductor laser manufacturing method, a low-reflection coating of an oxide is formed on a cleavage plane that is to be an end face of the resonator of the semiconductor laser.

In the above-described semiconductor laser manufacturing method, the reactive gas may be a non-oxidation gas.

In the above-described semiconductor laser manufacturing method, the reactive gas may be a gas containing either nitrogen or hydrogen.

In the above-described semiconductor laser manufacturing method, the compound may be insulative.

In the above-described semiconductor laser manufacturing method, the predetermined wavelength may be a semiconductor laser emission wavelength.

In the above-described semiconductor laser manufacturing method, the target material may be selected from the group consisting of silicon, aluminum, titanium, zirconium, hafnium, zinc, cerium, tantalum, niobium, and strontium.

In the above-described semiconductor laser manufacturing method, a partial pressure ratio of the reactive gas to the inert gas in the process gas may be 5% to 100%.

In the above-described semiconductor laser manufacturing method, a partial pressure ratio of the reactive gas to the inert gas in the process gas may be 10% to 30%.

In the above-described semiconductor laser manufacturing method, the sputtering apparatus may be an ECR sputtering apparatus.

The above object is also fulfilled by a semiconductor laser manufacturing method for manufacturing a semiconductor laser by forming a dielectric film on a semiconductor laminated structure using a sputtering apparatus, the method comprising: a first step of placing the semiconductor laminated structure in the sputtering apparatus; a second step of introducing a first process gas containing a first reactive gas and an inert gas into the sputtering apparatus, and then putting the first process gas into a plasma state; and a third step of exposing a target material and a predetermined portion of the semiconductor laminated structure to the first process gas in the plasma state while no voltage is applied to the target material, causing a reaction of the target material and the first reactive gas to form an insulative material so that a film of the insulative material is formed on the predetermined portion of the semiconductor laminated structure; a fourth step of, after the third step, introducing a second process gas containing a second reactive gas and an inert gas into the sputtering apparatus, and then putting the process gas into a plasma state, and putting the second process gas into a plasma state; and a fifth step of exposing the target material and the predetermined portion of the semiconductor laminated structure, on which the insulative material film is formed, to the second process gas in the plasma state while a voltage is applied to the target material, causing a reaction of the target material and the second reactive gas to form a dielectric material so that a film of the dielectric material is formed on the insulative material film at the predetermined portion of the semiconductor laminated structure.

In the above-described semiconductor laser manufacturing method, the first reactive gas and the second reactive gas may be a same gas.

The following describes experimental results demonstrating the semiconductor laser manufacturing method of the present invention is actually able to fulfill the above object.

In this experiment, the plasma cleaning was performed on the GaAs substrate of the samples under the condition (iii)

shown in Table 3 using the ECR sputtering apparatus 5, in a same manner as the experiments under conditions (i) and (ii).

TABLE 3

| Conditions | Plasma cleaning gas | Plasma cleaning duration |
| --- | --- | --- |
| (iii) | Argon gas (30 sccm) + nitrogen gas (3 sccm) | 10 minutes |

The surface of the GaAs substrate after the plasma cleaning was analyzed by the Augier electron spectroscopy. The following Table 4 shows the analysis results.

TABLE 4

| Conditions | Plasma cleaning gas | Detected elements |
| --- | --- | --- |
| (iii) | Argon gas (30 sccm) + nitrogen gas (3 sccm) | Silicon, nitrogen, oxygen |

The following findings were obtained from the analysis results shown in Table 4.

After the plasma cleaning was performed using a gas containing argon gas and nitrogen gas (condition (iii)), silicon and nitrogen were detected on the surface of the GaAs substrate, where the amount of the detected silicon was approximately the same as that of the detected nitrogen. Furthermore, the amount of the detected silicon was approximately the same as the amount of silicon detected after a plasma cleaning that was performed using only argon gas.

It is presumed from the analysis results that a silicon nitride film was formed on the GaAs substrate during the plasma cleaning.

The silicon nitride film does not absorb light of shorter wavelengths of not higher than 800 nm. When such a silicon nitride film is formed on an end face of the resonator of the semiconductor laser, it suppresses the lowering of the COD level.

BRIEF DESCRIPTION OF THE DRAWINGS

These and the other objects, advantages and features of the invention will be come apparent from the following description thereof taken in conjunction with the accompanying drawings which illustrate a specific embodiment of the invention. In the drawings.

DESCRIPTION OF THE PREFERRED EMBODIMENT

The following describes a semiconductor laser manufacturing method as a preferred embodiment of the present invention, with reference to the attached drawings. It should be noted here that reference signs commonly included in two or more drawings indicate a same element.

<1 Semiconductor Laminated Structure Manufacturing Step>

First, the step of manufacturing a bar-shaped semiconductor laminated structure, which is a main body of a AlGaInP base ridge-geometry red high-output semiconductor laser, will be described with reference to FIGS. 1–5.

Figure 1:
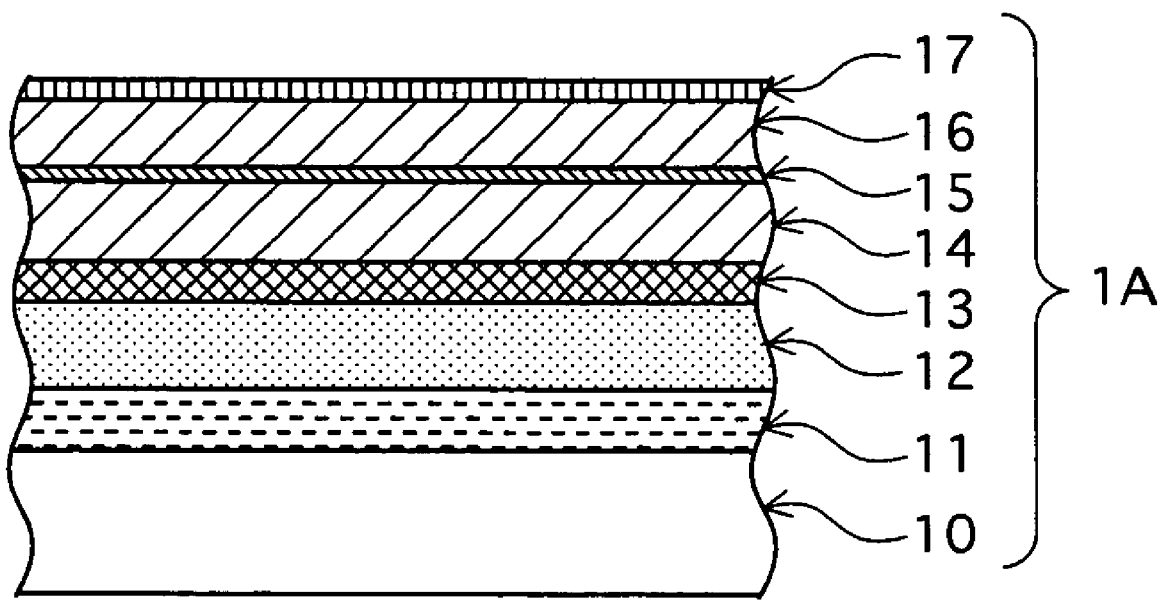
FIG. 1 shows a laminated structure of a semiconductor wafer in the first manufacturing stage.

FIG. 1 shows a laminated structure of a semiconductor wafer in the first manufacturing stage.

As shown in FIG. 1, a semiconductor wafer 1A is manufactured in the first manufacturing stage by forming layers 11–17 on an n-type GaAs substrate 10 in the stated order by the metalorganic chemical vapor deposition (hereinafter, MOCVD), where the layers 11–17 are: an n-type AlGaInP buffer layer 11; an n-type AlGaInP cladding layer 12; a quantum well active layer 13; a p-type AlGaInP first cladding layer 14; a p-type GaInP etching stop layer 15; a p-type AlGaInP second cladding layer 16; and a p-type GaInP intermediate layer 17.

Figure 2:
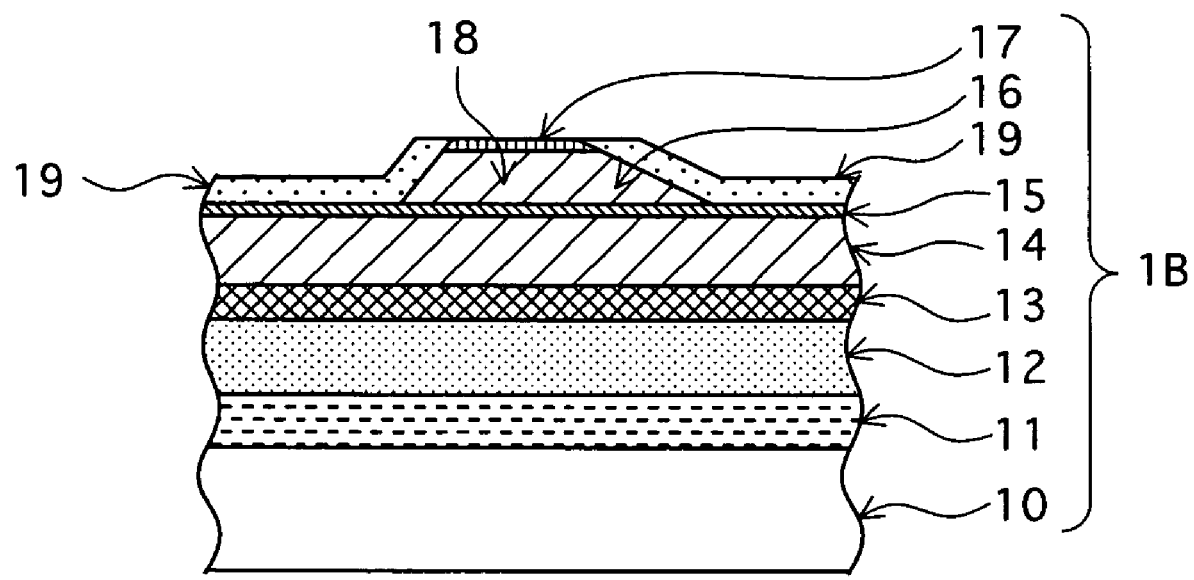
FIG. 2 shows a laminated structure of the semiconductor wafer in the second manufacturing stage.

FIG. 2 shows a laminated structure of the semiconductor wafer in the second manufacturing stage.

After the semiconductor wafer 1A is manufactured in the first manufacturing stage, a ridge stripe 18, which is to be a waveguide, is formed on the semiconductor wafer 1A by performing an etching on the p-type AlGaInP second cladding layer 16 and the p-type GaInP intermediate layer 17 by the wet or dry etching method.

After this, an n-type AlInP current blocking layer 19 is further formed on the semiconductor wafer 1A. Then, a portion of the n-type AlInP current blocking layer 19 that covers the ridge stripe 18 is removed. This completes manufacturing a semiconductor wafer 1B in the second manufacturing stage.

It should be noted here that although not illustrated in the drawings, part of the n-type AlInP current blocking layer 19 that is in the vicinity of a boundary and is to be cleaved later remains on the ridge stripe 18 partially covering thereof. And immediately below the part of the n-type AlInP current blocking layer 19 in the vicinity of the boundary, a window structure, in which impurities such as Zn are doped and disordered, is formed.

The n-type AlInP current blocking layer 19 may be formed by the selective area growth method.

Figure 3:
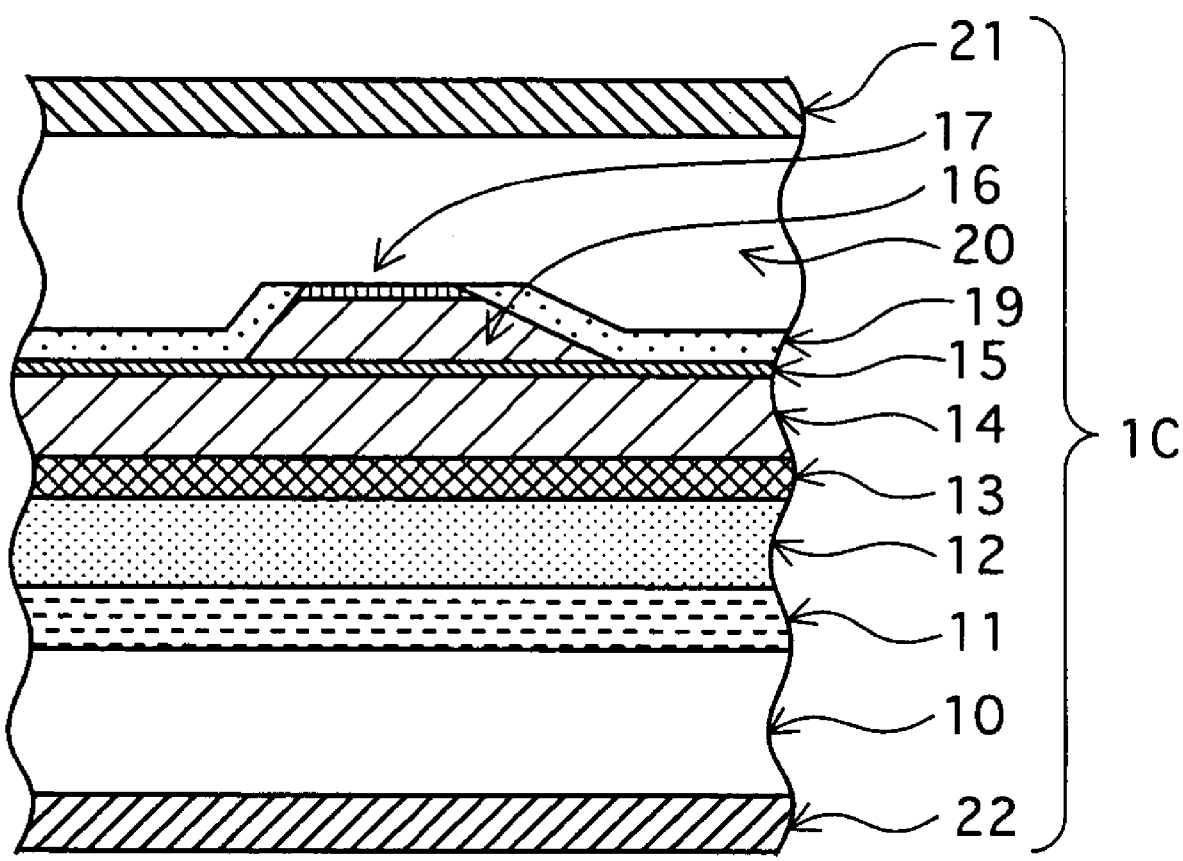
FIG. 3 shows a laminated structure of the semiconductor wafer in the third manufacturing stage.

FIG. 3 shows a laminated structure of the semiconductor wafer in the third manufacturing stage.

After the semiconductor wafer 1B is manufactured in the second manufacturing stage, a p-type GaAs contact layer 20 is formed to cover the surface of the semiconductor wafer 1B. A p-type side electrode 21 is then formed on the p-type GaAs contact layer 20. Also, an n-type side electrode 22 is formed on the surface of the opposite side of the semiconductor wafer 1B, namely on the lower-side surface of the n-type GaAs substrate 10, as shown in FIG. 3. This completes manufacturing a semiconductor wafer 1C in the third manufacturing stage.

The semiconductor wafer 1C is then cleaved into bar-shaped semiconductor laminated structures.

Figure 4:
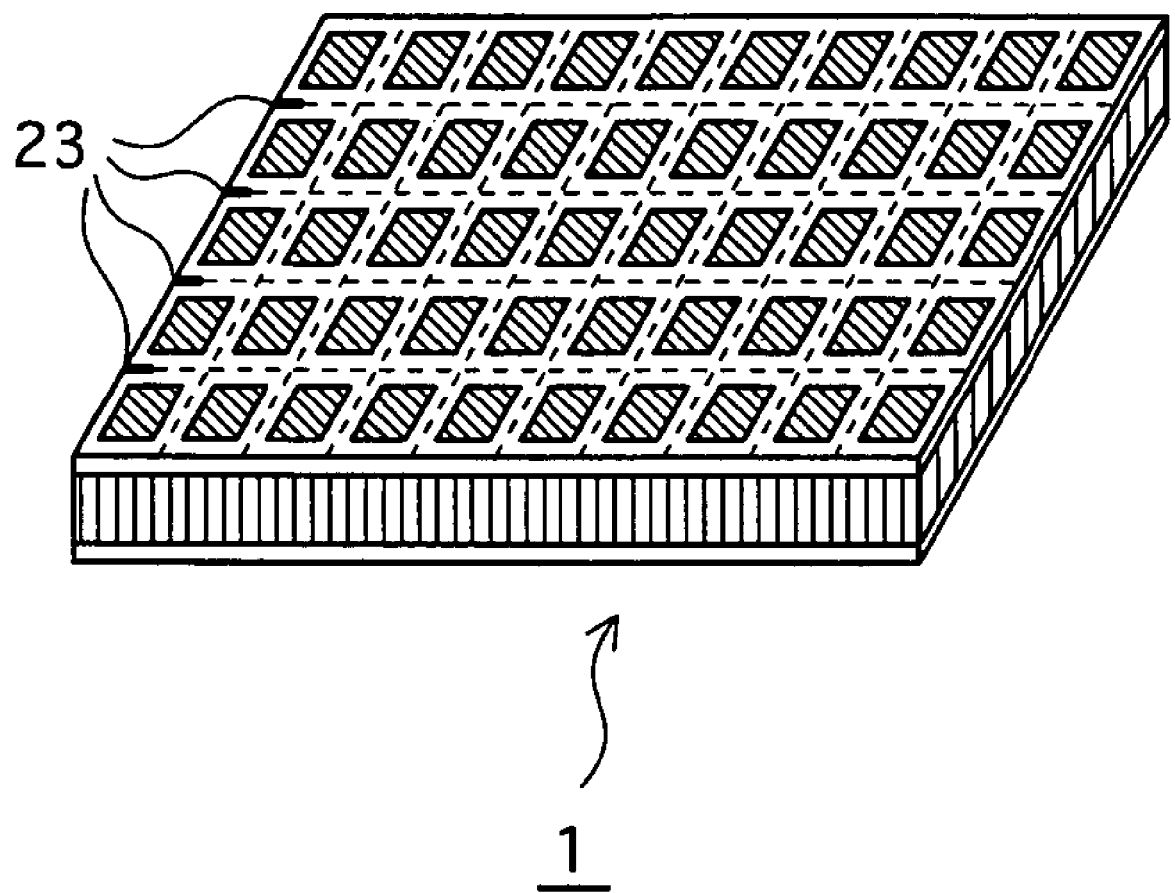
FIG. 4 is a perspective view of a plate-shaped semiconductor laminated structure.

FIG. 4 is a perspective view of a semiconductor laminated structure 1.

The plate-shaped semiconductor laminated structure 1 shown in FIG. 4 is formed by cleaving the disc-shaped. semiconductor wafer 1C. As shown in FIG. 4, a plurality of scribe cuts 23 have been made in a surface of the semiconductor laminated structure 1, in the same directions at regular intervals. The semiconductor laminated structure 1 is cleaved in the air into bar-shaped semiconductor laminated structures using the scribe cuts 23 as the starting point.

Figure 5:
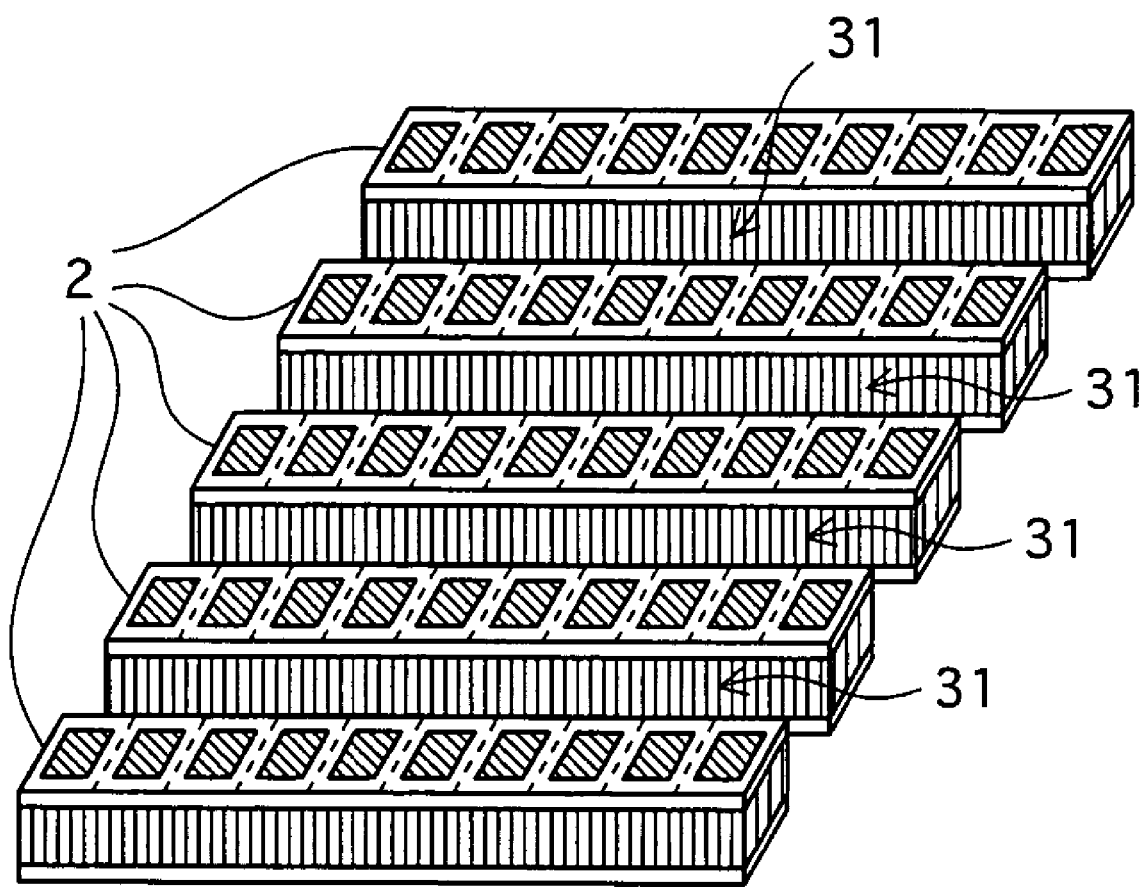
FIG. 5 is a perspective view of bar-shaped semiconductor laminated structures.

FIG. 5 is a perspective view of bar-shaped semiconductor laminated structures 2 that were manufactured by cleaving the semiconductor laminated structure 1 shown in FIG. 4. Each of the bar-shaped semiconductor laminated structures 2 shown in FIG. 5 has a pair of cleavage planes 31 that are to be end faces of resonators of semiconductor lasers.

<2 Plasma Cleaning Step>

Next, the step of performing a plasma cleaning on the cleavage planes 31 of the manufactured bar-shaped semiconductor laminated structures will be described with reference to FIGS. 6–8.

Figure 6:
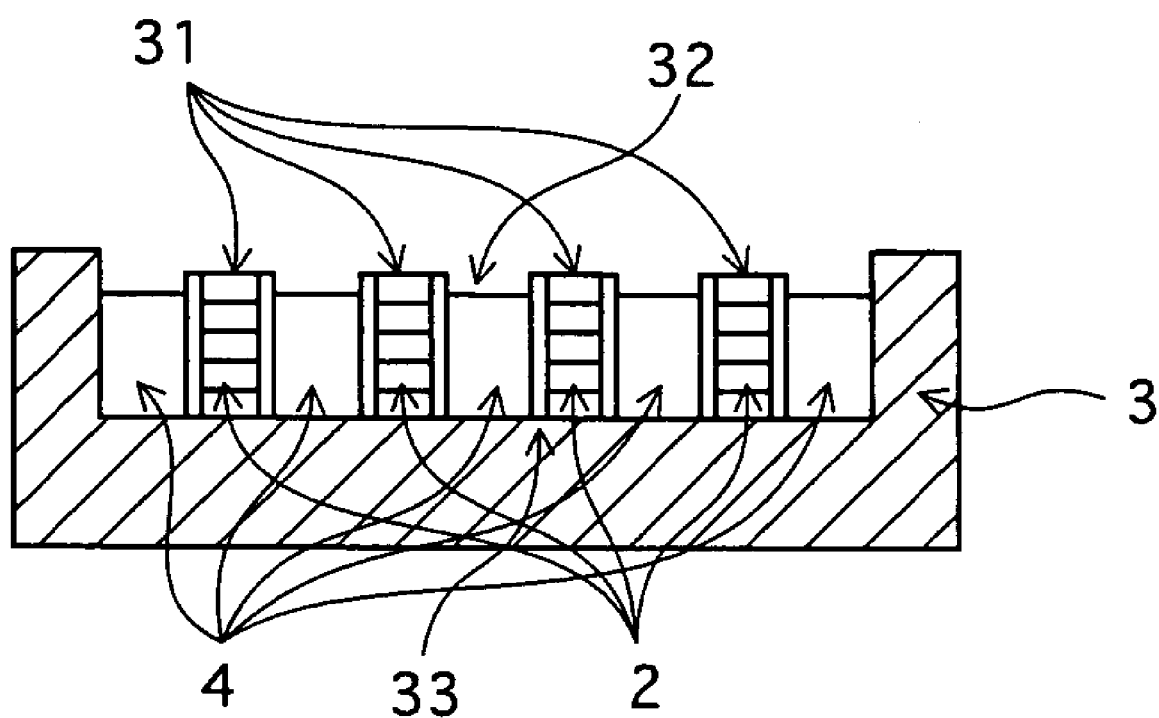
FIG. 6 shows bar-shaped semiconductor laminated structures 2 placed on a jig in alignment.

FIG. 6 is a cross sectional view of a jig and the bar-shaped semiconductor laminated structures 2 placed on the jig in alignment.

As shown in FIG. 6, the bar-shaped semiconductor laminated structures 2 and spacers 4 are alternately on a bottom face 33 of a jig 3 so that one cleavage plane 31 of each semiconductor laminated structure 2 is in contact with the bottom face 33 and the other cleavage plane 31 there of is exposed to an opening 32.

The spacers 4 are used to fix the locations of the bar-shaped semiconductor laminated structures 2, and prevent a dielectric layer from being formed on the electrodes of the semiconductor laminated structures 2.

The jig 3, on which the bar-shaped semiconductor laminated structures 2 have been set as described above, is placed in the coating forming chamber 60 so that the side of the jig 3 having the opening 32 faces toward the plasma chamber 64.

Figure 7:
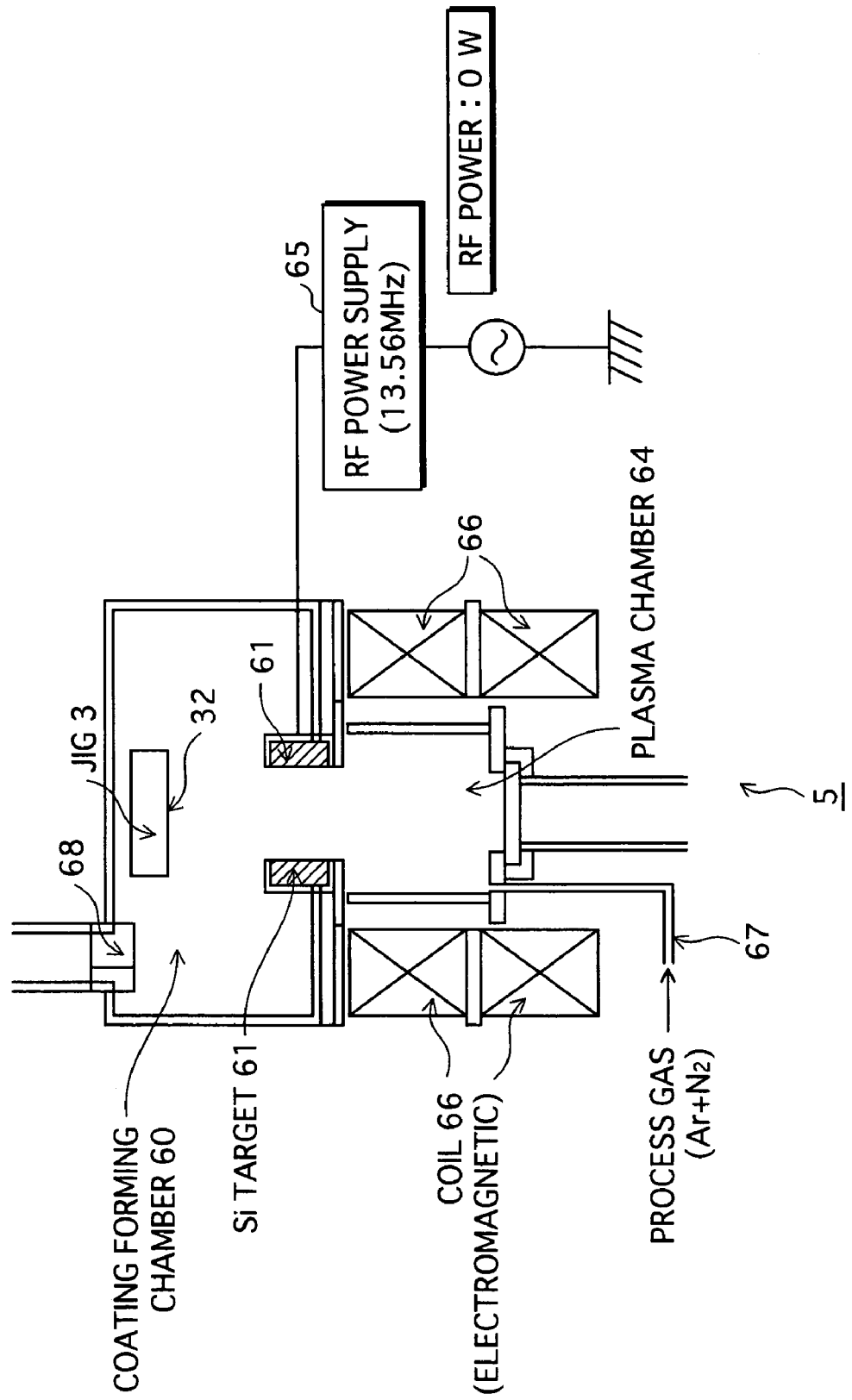
FIGS. 7 to 10 are cross-sectional views of an ECR sputtering apparatus in the plasma cleaning step and the coating step.
Figure 8:
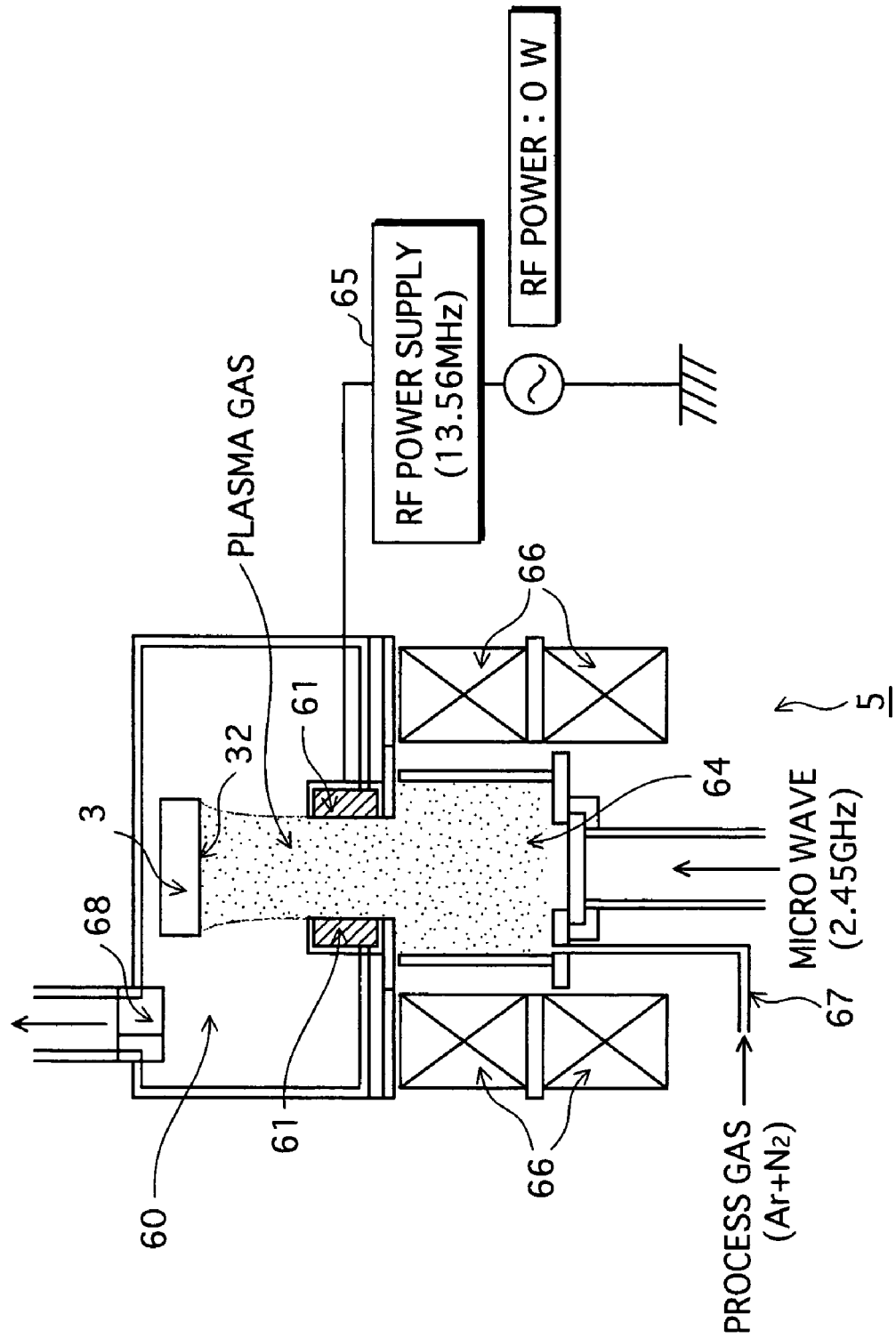

FIGS. 7 and 8 are cross-sectional views of the ECR sputtering apparatus 5. The flow of the plasma cleaning step will be described with reference to these drawings.

After the jig 3 is placed in the coating forming chamber 60, air is evacuated from the coating forming chamber 60. A first process gas containing argon gas and nitrogen gas is introduced into the plasma chamber 64 (FIG. 7). It should be noted here that the internal pressure of the ECR sputtering apparatus 5 during introduction of the process gas is $10^{-1}$ Pa.

A micro wave having 600 W of intensity and 2.45 GHz of frequency is then introduced into the plasma chamber 64 so that the first process gas in the chamber is put into the ECR plasma state by the introduced micro wave and the magnetic fields formed by the coils 66. This allows the cleavage planes 31 of the bar-shaped semiconductor laminated structures 2 set on the jig 3 to be exposed to the resultant plasma gas (FIG. 8).

In the above-stated operation, to restrict the amount of the sputtering occurring at the silicon target 61 to as small a degree as possible, no voltage is applied to the silicon target 61, and the jig 3 is set to a normal temperature.

The amount of energy of the ions that reach the cleavage planes 31 is determined by the ECR divergence magnetic field distribution since no voltage is applied to the jig 3. When the jig 3 is 20 cm away from the ECR point, the amount of ion energy is approximately 10–20 eV. The ion energy at such a level is enough to perform the plasma cleaning, and hardly causes a defect to the cleavage planes 31.

Also, in this process, a sheath potential of approximately −5V to −10V is generated at the surface of the silicon target 61. Due to the generated sheath potential, argon ions collide with the silicon target 61 to sputter out silicon ions. The sputtered-out silicon ions react with nitrogen ions contained in the process gas in the ECR plasma state to form silicon nitride, which is heaped up on the surface of the cleavage planes 31.

With the above-described plasma cleaning performed on the cleavage planes 31 of the bar-shaped semiconductor laminated structures 2, impurities stuck to the surface of the cleavage planes 31 such as organic substances, oxygen, or oxide films are removed from the surface and a thin silicon nitride layer is formed on the surface.

<3 Coating Step>

The following describes a low-reflection coating step in which an oxide silicon film is formed on the silicon nitride layer that has been formed on the surface of the cleavage planes 31 of the bar-shaped semiconductor laminated structures 2 in the plasma cleaning step.

Figure 9:
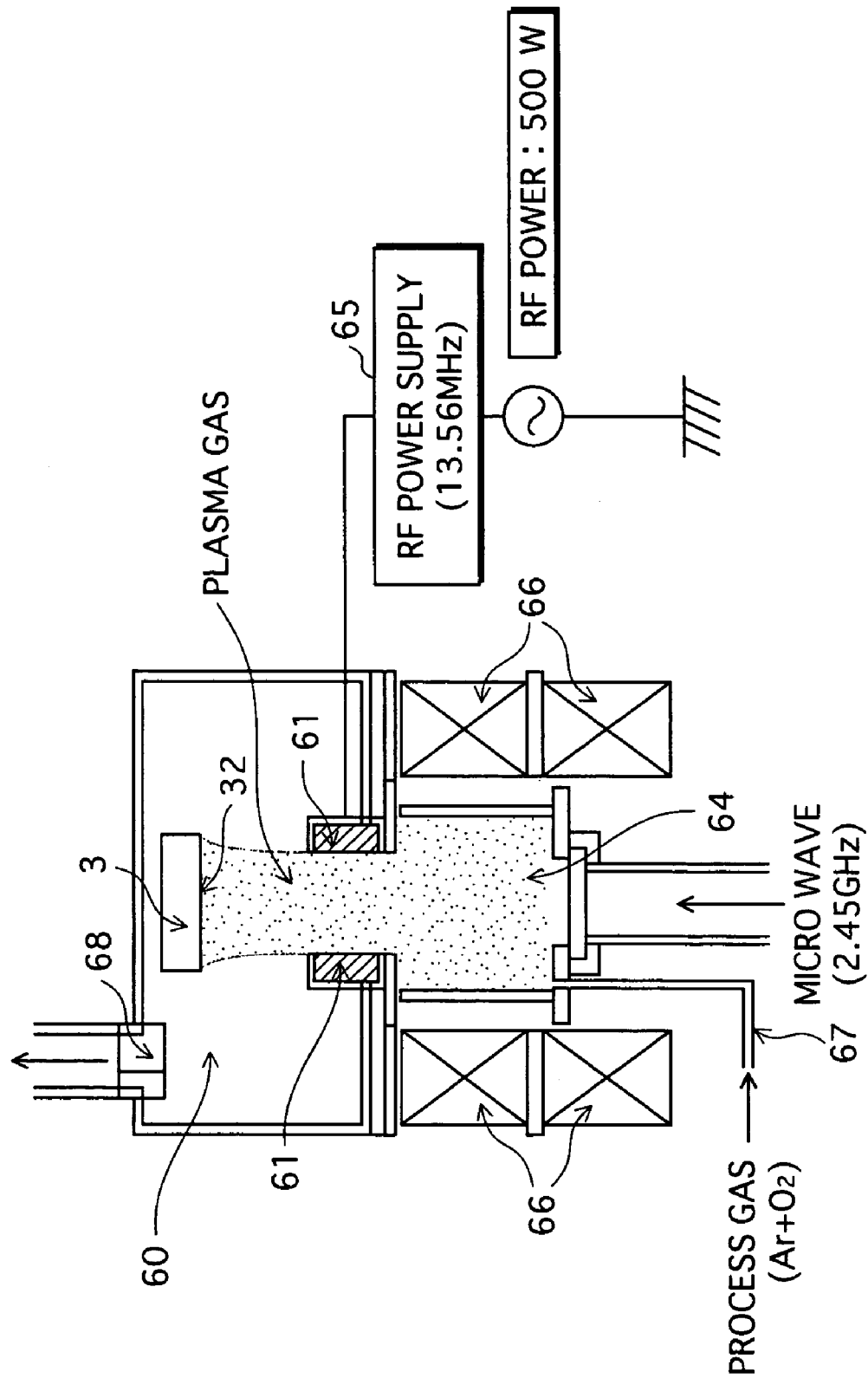

FIG. 9 is a cross-sectional view of the ECR sputtering apparatus 5. The flow of the low-reflection coating step will be described with reference to FIG. 9.

First, a second process gas containing argon gas (flow rate 30 sccm) and oxygen gas (flow rate 10 sccm) is introduced into the plasma chamber 64. Then, a micro wave having 600 W of intensity and 2.45 GHz of frequency is introduced into the plasma chamber 64 so that the second process gas in the chamber is put into the ECR plasma state by the introduced micro wave and the magnetic fields formed by the coils 66. This allows the cleavage planes 31 of the bar-shaped semiconductor laminated structures 2 set on the jig 3 to be exposed to the resultant plasma gas (FIG. 9).

The internal pressure of the ECR sputtering apparatus 5 during introduction of the second process gas is $10^{-1}$ Pa. The output value of the RF power supply connected to the silicon target is 600 W.

Argon ions contained in the second process gas in the ECR plasma state collide with the silicon target 61 to sputter out silicon ions. The sputtered-out silicon ions reach the surface of the cleavage planes 31 and react with oxygen to form silicon oxide ions, which are heaped up on the surface of the cleavage planes 31 to form a silicon oxide film.

In the above-described process, the amount of plasma energy that reaches the cleavage planes 31 is approximately 10–20 eV. The ion energy at such a level hardly causes a damage such as a crystal defect to the cleavage planes 31.

The reflection rate at the end face of the resonator depends on the thickness of the silicon oxide film, whose surface is actually the end face of the resonator, formed on the cleavage planes 31. The thickness of the silicon oxide film is controlled by the duration for which the cleavage planes 31 are exposed to the plasma gas. For example, the reflection rate at the end face of the resonator is 4% when the thickness of the silicon oxide film is 100 nm and the semiconductor laser has 660 nm of laser emission wavelength.

After the low reflection rate coating is formed on the cleavage planes 31 on one side of the bar-shaped semiconductor laminated structures 2, the jig 3 is extracted from the ECR sputtering apparatus 5. Then, after the bar-shaped semiconductor laminated structures 2 are re-placed in the jig 3 so that the cleavage planes 31 on the opposite side thereof are exposed to the opening 32, the jig 3 is re-set in the ECR sputtering apparatus 5. And then the above-described plasma cleaning is also performed on the cleavage planes 31 on the opposite side.

Figure 10:
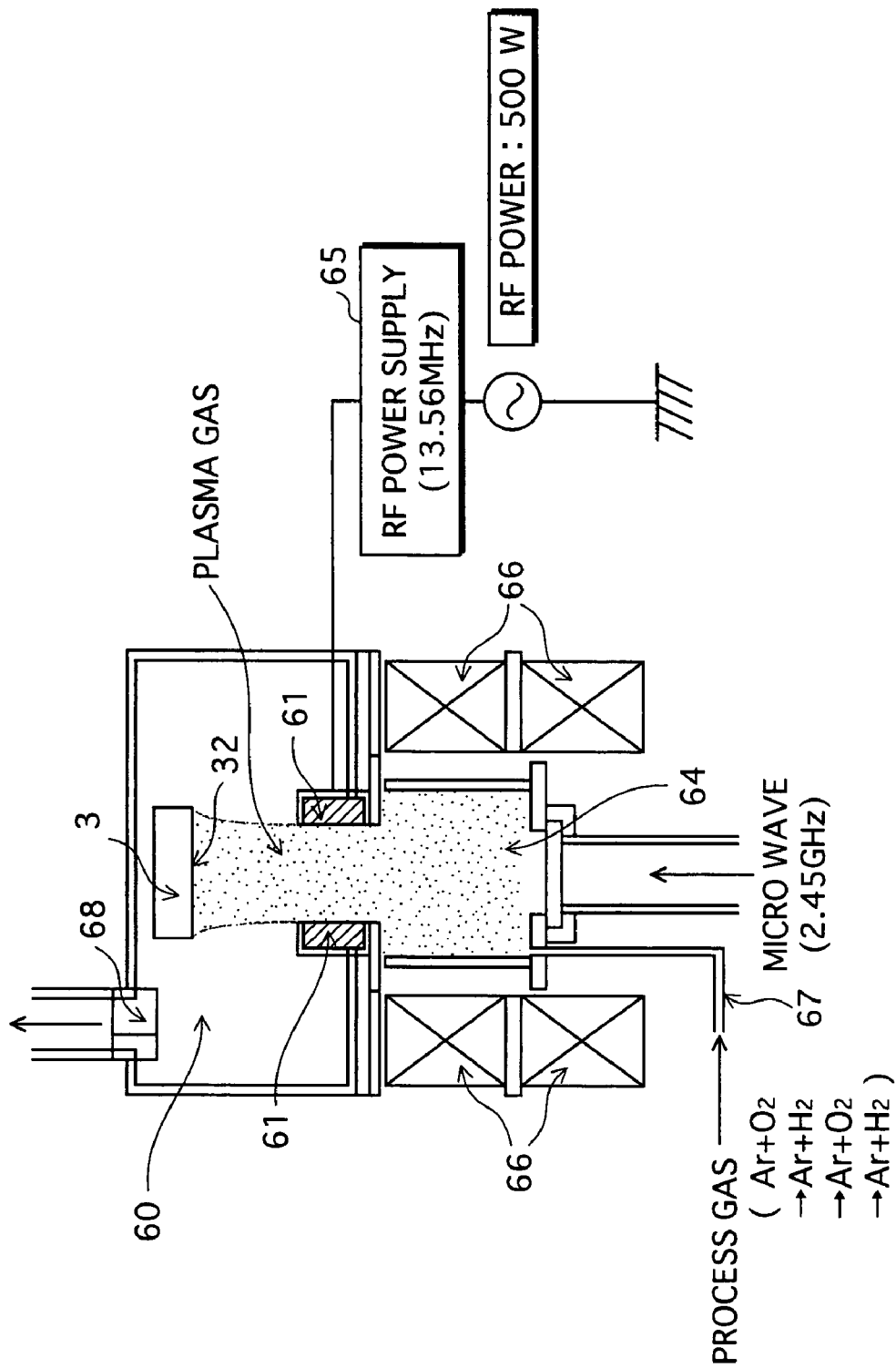

FIG. 10 a cross-sectional view of the ECR sputtering apparatus 5. The flow of the high-reflection coating step will be described with reference to FIG. 10.

After the plasma cleaning is performed, the cleavage planes 31 are exposed to the second process gas in the ECR plasma state. This allows a silicon oxide film to be formed on the cleavage planes 31. A third process gas containing argon gas and hydrogen gas is then introduced into the plasma chamber 64, and is put into the ECR plasma state. The cleavage planes 31 are exposed to the third process gas in the ECR plasma state. This allows a hydrogen-added amorphous silicon film to formed on the cleavage planes 31. On the hydrogen-added amorphous silicon film, a silicon oxide film and a hydrogen-added amorphous silicon film are formed in the stated order (FIG. 10).

With the above-described process, a high-reflection coating consisting of the four layers of a silicon oxide film, a hydrogen-added amorphous silicon film, a silicon oxide film, and a hydrogen-added amorphous silicon film is formed on the cleavage planes 31.

Figure 11:
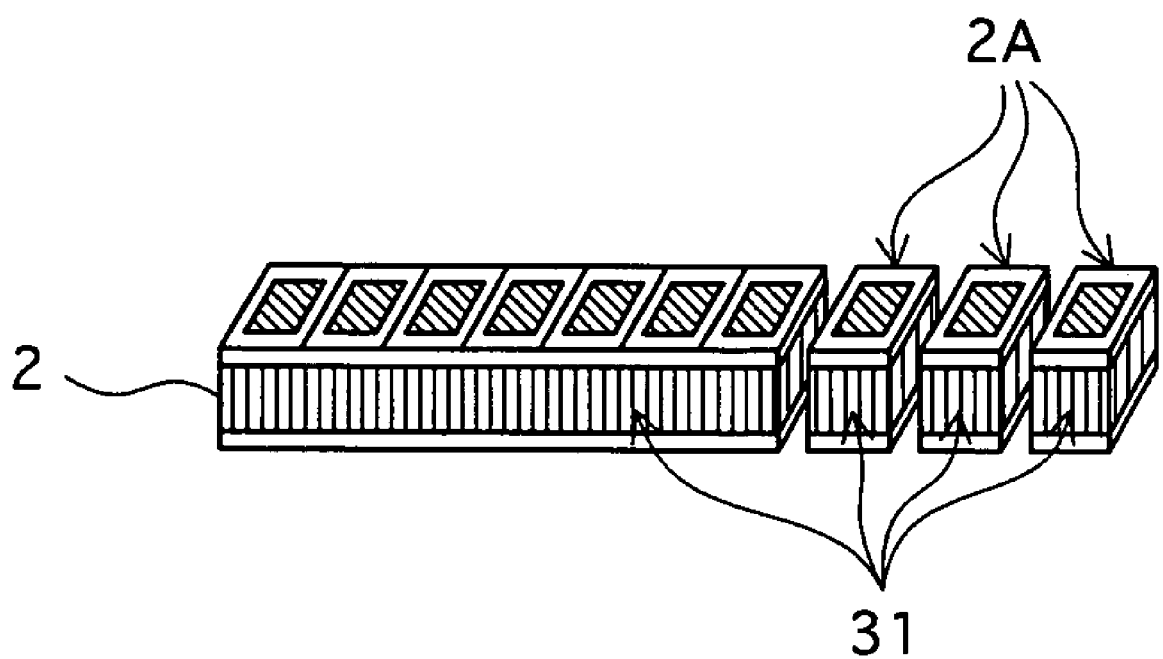
FIG. 11 is a perspective view of a half-finished semiconductor laser.

The bar-shaped semiconductor laminated structures 2 having been subjected to the above-described plasma cleaning and coating steps are, as shown in FIG. 11, further divided into pieces referred to as half-finished semiconductor lasers 2A.

<4 Consideration>

Now, results of measurement of the COD level and the surge withstanding voltage will be considered in terms of the four sample semiconductor lasers that were manufactured with the plasma cleaning under different conditions shown in the following Table 5, respectively.

TABLE 5

| Conditions | Plasma cleaning gas | Plasma cleaning duration |
|---|---|---|
| (a) | Argon gas (30 sccm) | 4 minutes |
| (b) | Argon gas (30 sccm) | 10 minutes |
| (c) | Argon gas (30 sccm) + nitrogen gas (3 sccm) | 4 minutes |
| (d) | Argon gas (30 sccm) + nitrogen gas (3 sccm) | 10 minutes |

Of the above four conditions, conditions (a) and (b) are of the conventional plasma cleaning, and conditions (c) and (d) are of the plasma cleaning of the present embodiment.

Figure 12:
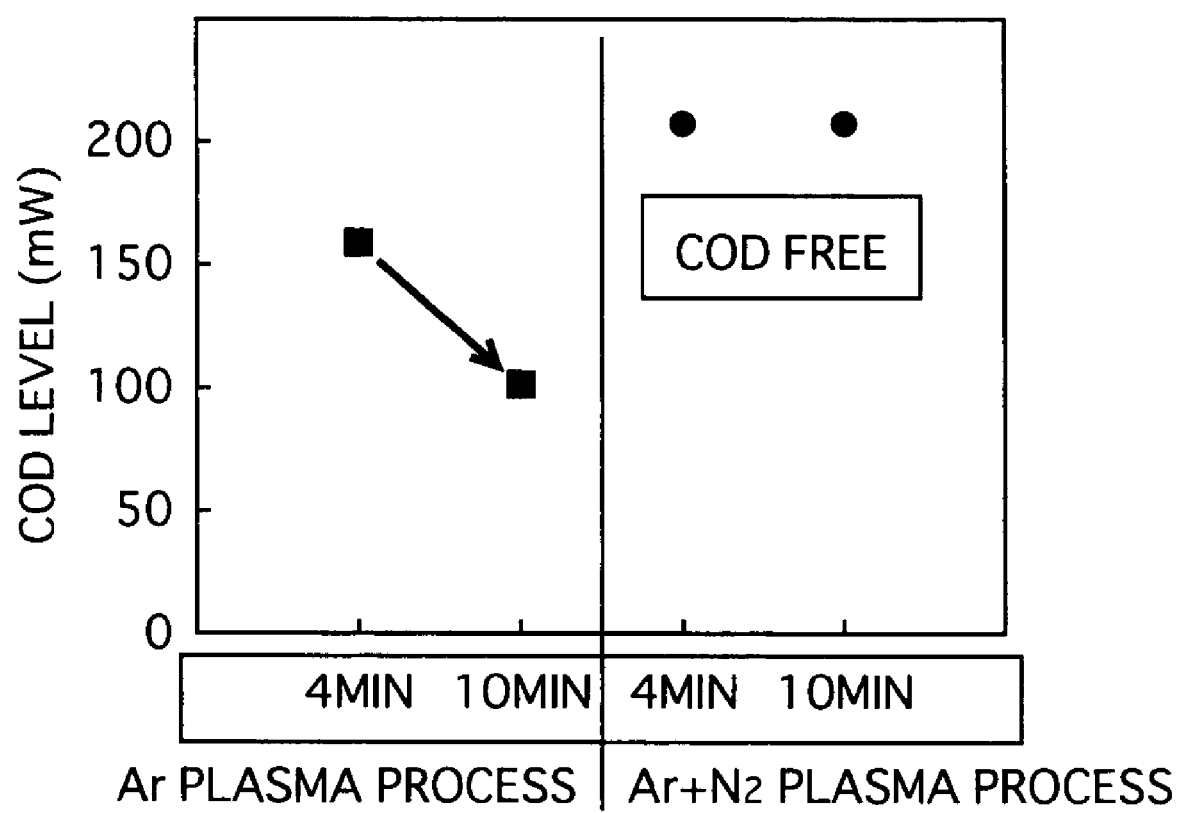
FIG. 12 shows the COD levels of the sample semiconductor lasers in comparison between the plasma cleaning by the embodiment of the present invention and the conventional plasma cleaning.
Figure 13:
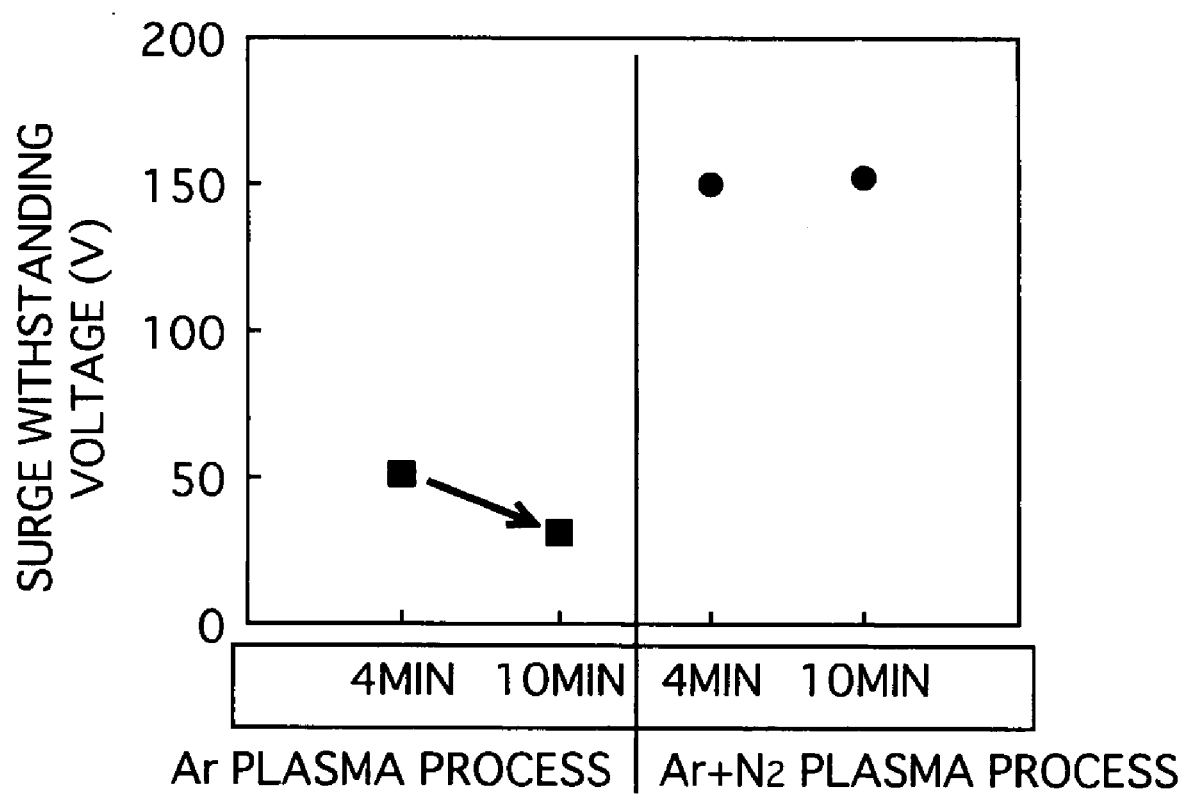
FIG. 13 shows the surge withstanding voltage values of the sample semiconductor lasers in comparison between the plasma cleaning by the embodiment of the present invention and the conventional plasma cleaning.

FIG. 12 shows the COD levels of the sample semiconductor lasers in comparison between the plasma cleaning by the present embodiment and the conventional plasma cleaning. FIG. 13 shows the surge with standing voltage values of the sample semiconductor lasers in comparison between the plasma cleaning by the present embodiment and the conventional plasma cleaning.

In the present embodiment, the surge withstanding voltage is presumed to be such a voltage that when a CR circuit having 200 pF and 0Ω applies one pulse to a semiconductor laser, the operating current increases by 20%.

With the conventional plasma cleaning in which only the argon gas is used, the COD level is lowered from 158 mW to 103 mW as the process duration increases as shown in FIG. 12, and the surge withstanding voltage is lowered from 50V to 30V as shown in FIG. 13.

In contrast, with the plasma cleaning of the present embodiment in which the first process gas containing the argon gas and the nitrogen gas is used, the COD level is not less than 200 mW regardless of the process duration, and the surge withstanding voltage is not less than 150V, which is approximately three times the conventional one, indicating improvement of the surge withstanding voltage as much.

Figure 14:
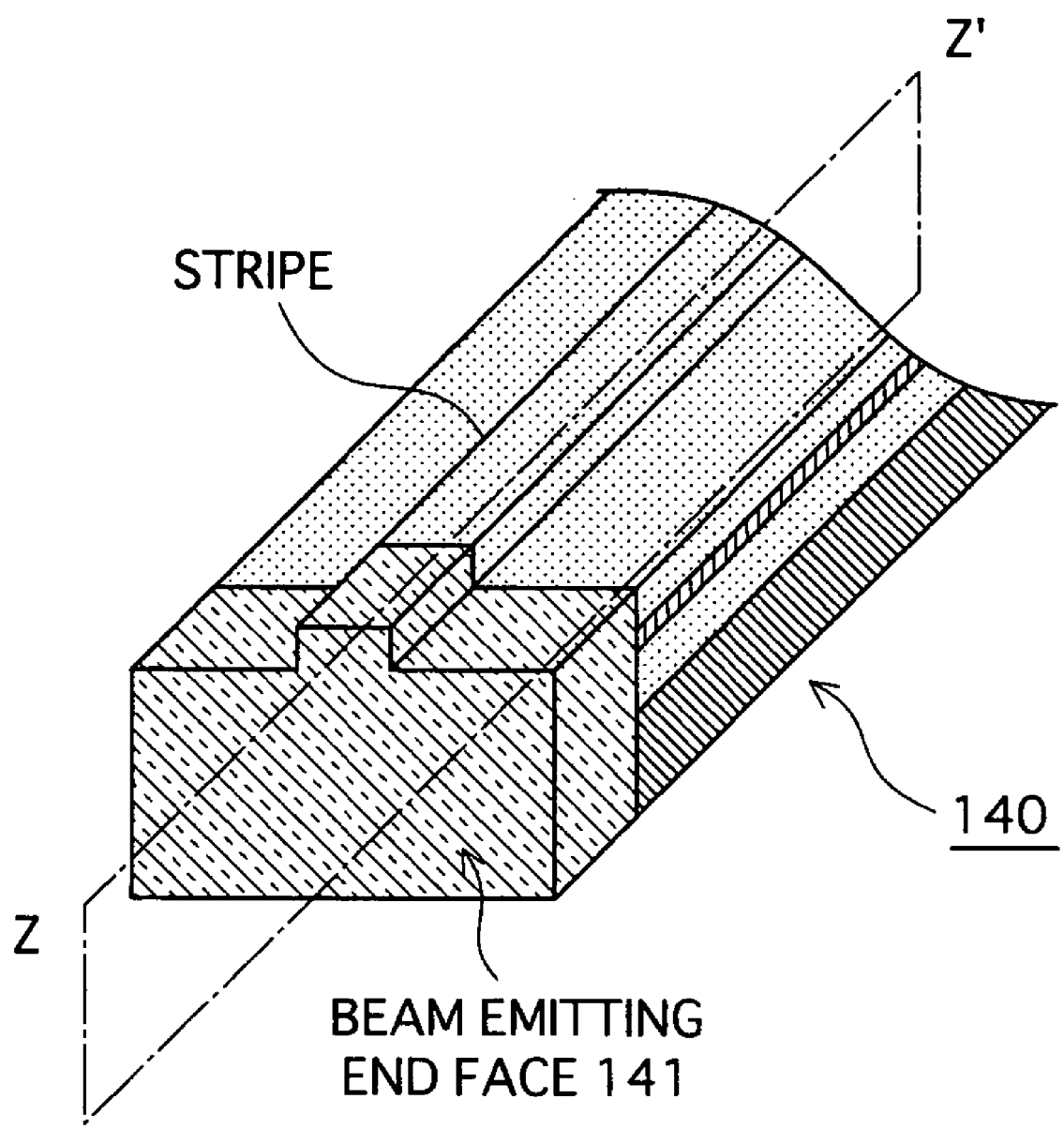
FIG. 14 illustrates the construction of a semiconductor laser in which an amorphous silicon thin film is formed on an end face of the resonator.
Figure 15:
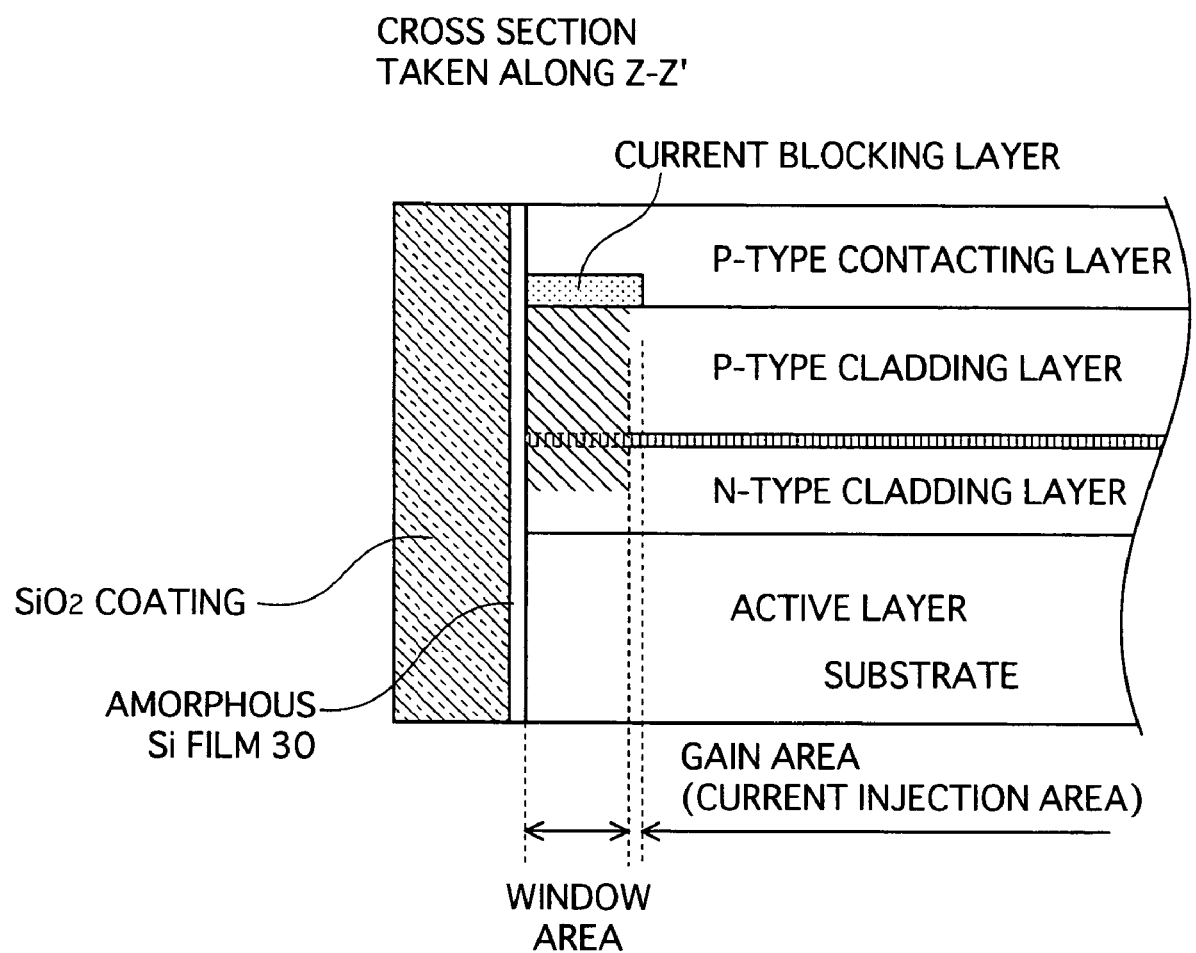
FIG. 15 is a cross sectional view of the semiconductor laser shown in FIG. 14.

FIG. 14 illustrates the construction of the semiconductor laser. FIG. 15 is a cross sectional view of the semiconductor laser 140 shown in FIG. 14 taken along the plane Z-Z', which is parallel to the longitudinal direction of the semiconductor laser 140 and is perpendicular to planes of the laminated layers of the semiconductor laser 140.

There has conventionally been a problem that when the amorphous film 30 is formed to cover the beam emitting end face 141 after the natural oxidation film is removed from the beam emitting end face 141, the leak current flows over the surface of the semiconductor laser 140, lowering the surge withstanding voltage.

On the other hand, as disclosed in the present embodiment, if a small amount of sputtering is performed using a mixture gas of the argon gas, which is inert gas, and the nitrogen gas, silicon nitride is attached to the beam emitting end face. This prevents the temperature rise, which is caused by the light absorption, in the vicinity of the end face, and prevents the band gap from reducing, thus reducing the COD occurrence rate.

Since it is an insulating film, the silicon nitride film suppresses the leak current, and increases the surge withstanding voltage.

<5 Supplemental Notes>

The present invention is not limited to the above-described embodiment, but can be applied to semiconductor lasers with different structures, and to different manufacturing procedure orders or different process parameters. The following are the specific example of such.

(1) The above-described plasma cleaning is also effective in manufacturing 400 nm-band blue semiconductor laser.

Figure 16:
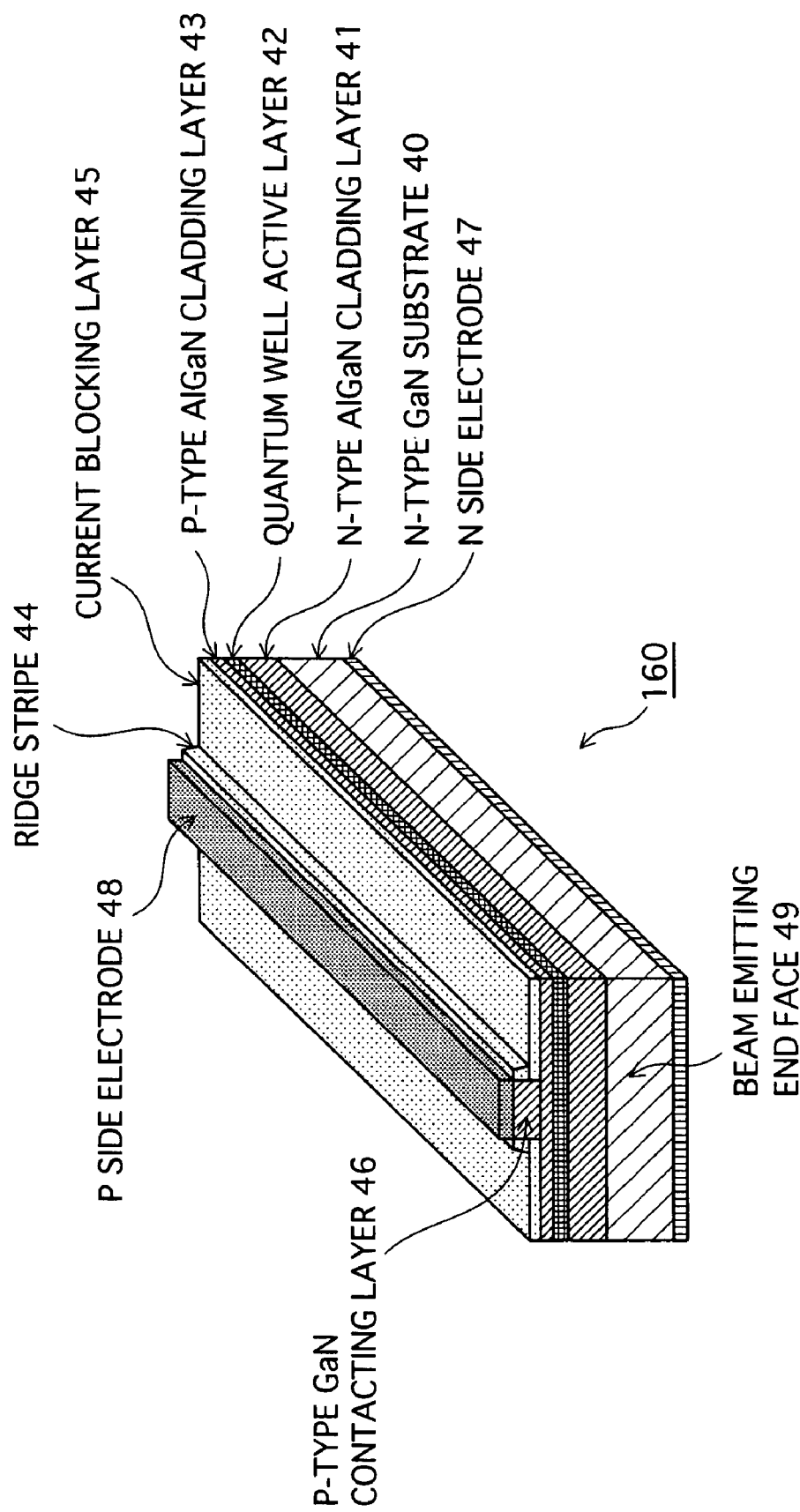
FIG. 16 shows the construction of 400 nm-band blue semiconductor laser.

FIG. 16 shows the construction of 400 nm-band blue semiconductor laser.

The 400 nm-band blue semiconductor laser 160 includes an n-type GaN substrate 40, n-type AlGaN cladding layer 41, quantum well active layer 42, p-type AlGaN cladding layer 43, ridge stripe 44, current blocking layer 45, p-type GaN contacting layer 46, n side electrode 47, and p side electrode 48.

The laser emission wavelength of the 400 nm-band blue semiconductor laser 160 is shorter than that of the above-described AlGaInP base ridge-geometry red high-output semiconductor laser. Accordingly, in the 400 nm-band blue semiconductor laser 160, the laser beams are absorbed by the amorphous silicon at higher rate than in the AlGaInP base ridge-geometry red high-output semiconductor laser.

For this reason, when an amorphous silicon film is formed between the coating and the end face of the 400 nm-waveband blue semiconductor laser 160, the light absorption exerts a larger influence, increasing the COD occurrence rate.

In contrast, the silicon nitride film does not absorb 400 nm-waveband light. Accordingly, with the silicon nitride film formed on the beam emitting end face 49 of the 400 nm-wave band blue semiconductor laser 160 by the above-described plasma cleaning of the present embodiment, the COD occurrence rate decreases and the laser characteristics are greatly improved.

(2) The above-described plasma cleaning using the process gas containing the argon gas and the nitrogen gas may be used to form a dielectric film as a current blocking layer during the process of manufacturing a semiconductor laser having a ridge-type stripe structure.

As one example, Japanese Laid-Open Patent Application No. 11-186650 discloses a semiconductor laser that has, as a current blocking layer, a dielectric film of $SiO_2$, $Ta_2O_5$, $ZrO_5$, $Nb_2O_5$, amorphous Si or the like.

Manufacturing semiconductor lasers of this type have several merits. For example, since it requires one MOCVD process, the manufacturing cost and the production lead time are reduced.

Figure 17:
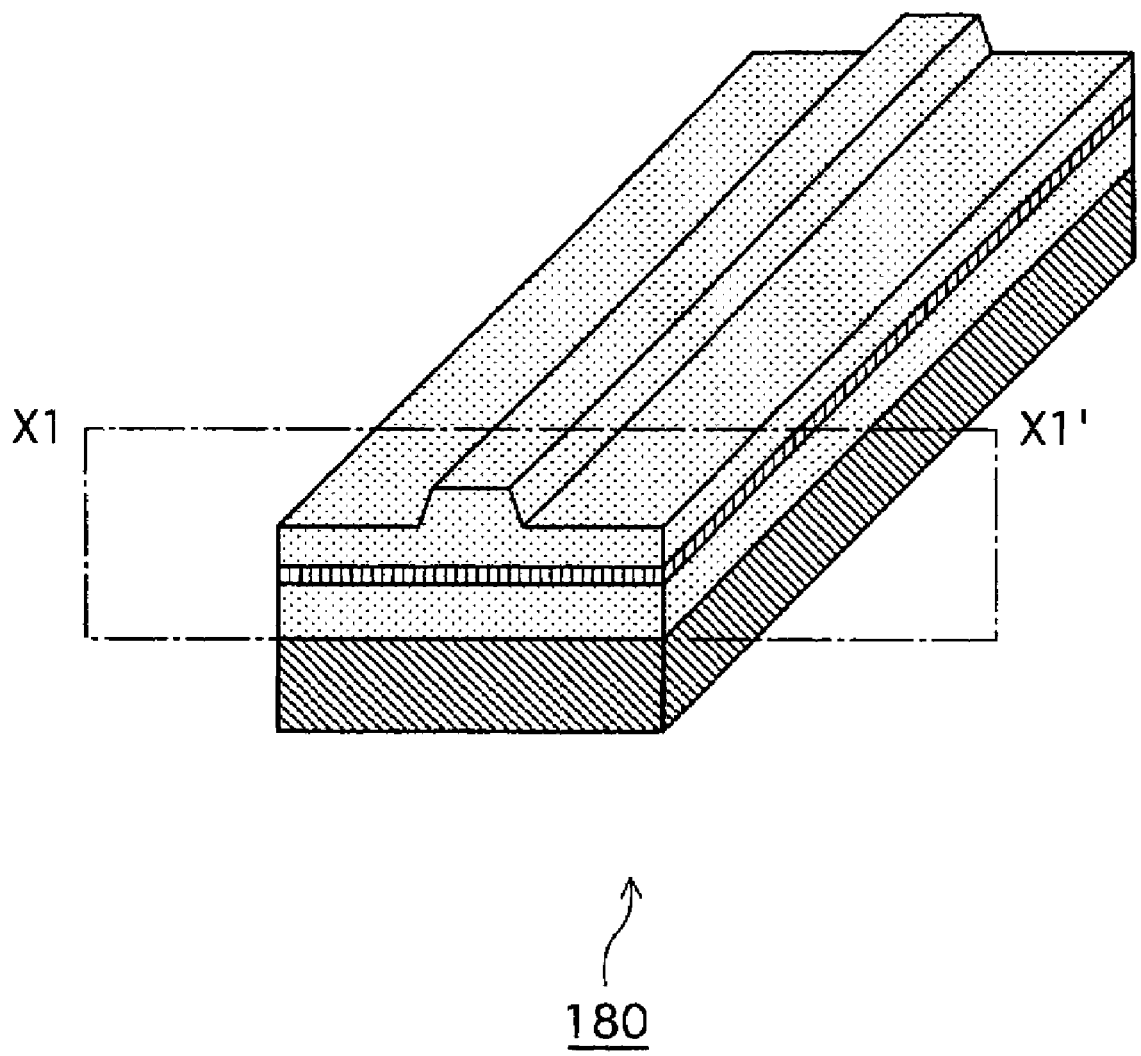
FIG. 17 is an external view of a semiconductor laser of a ridge-type stripe structure including a dielectric film that is formed by a plasma cleaning.
Figure 18:
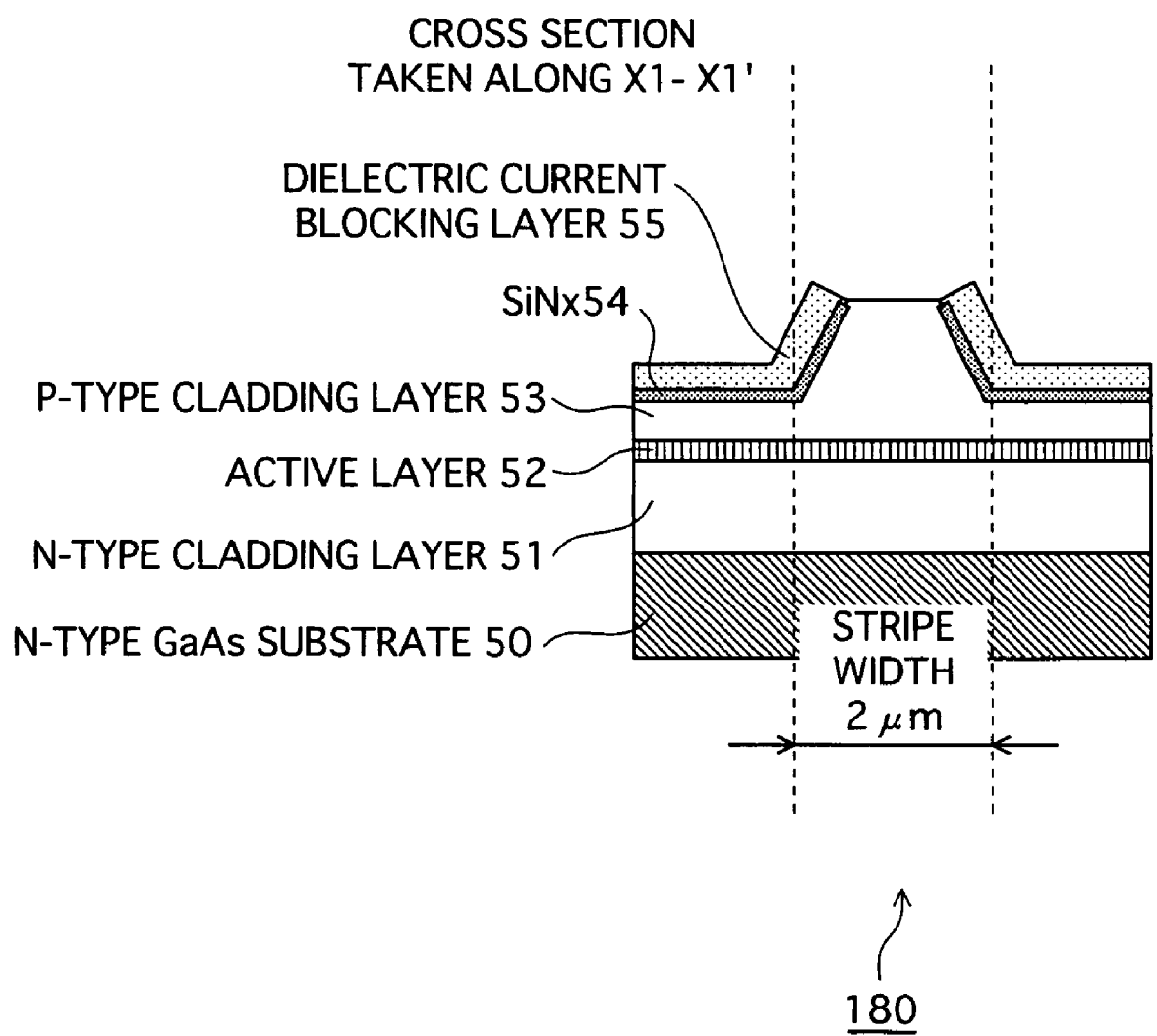
FIG. 18 is a cross sectional view of the semiconductor laser shown in FIG. 17 taken along the plane X1-X1', which is parallel to an end face of the resonator of the semiconductor laser.
Figure 19:
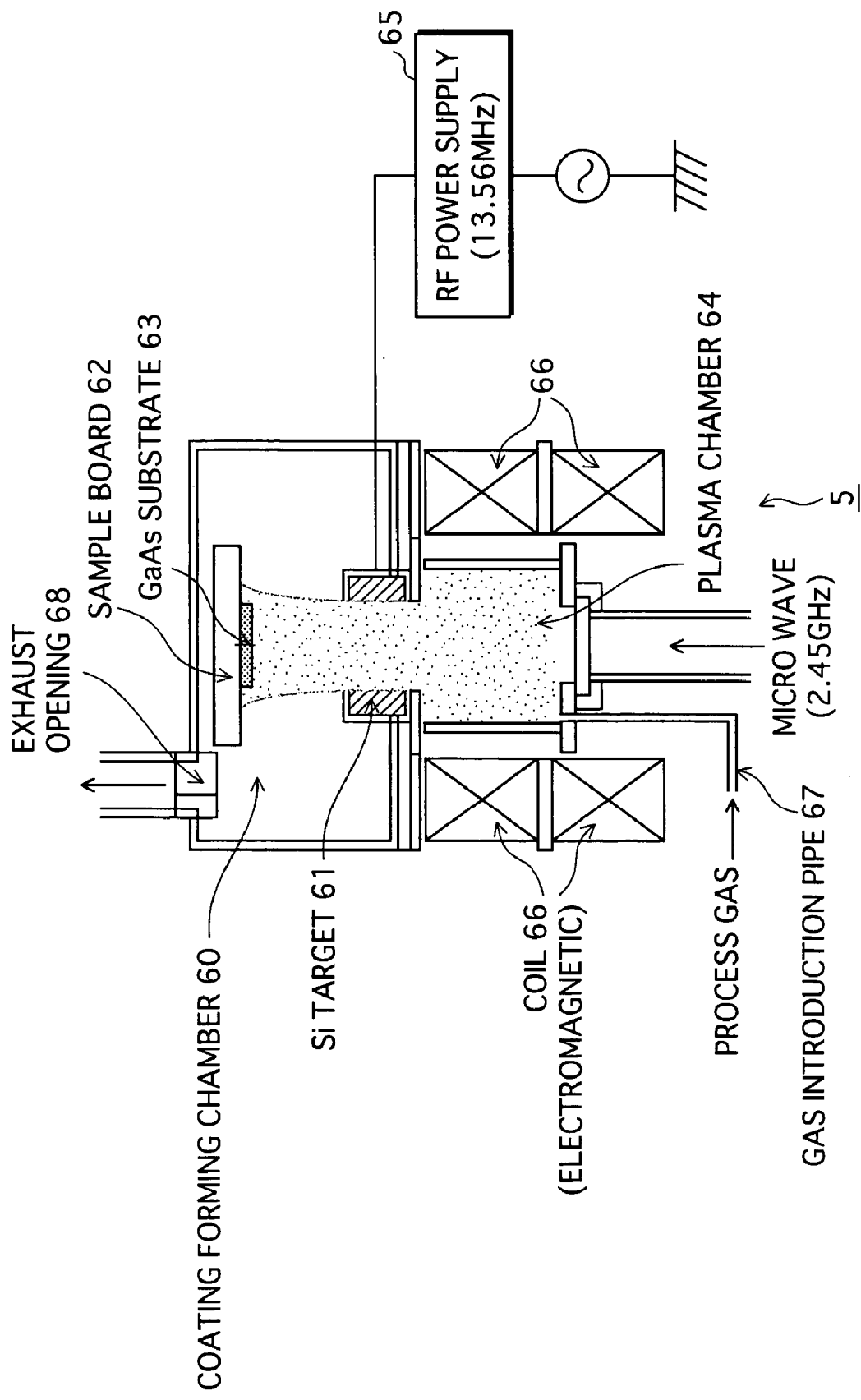
FIG. 19 is a cross-sectional view of the ECR sputtering apparatus.
Figure 20:
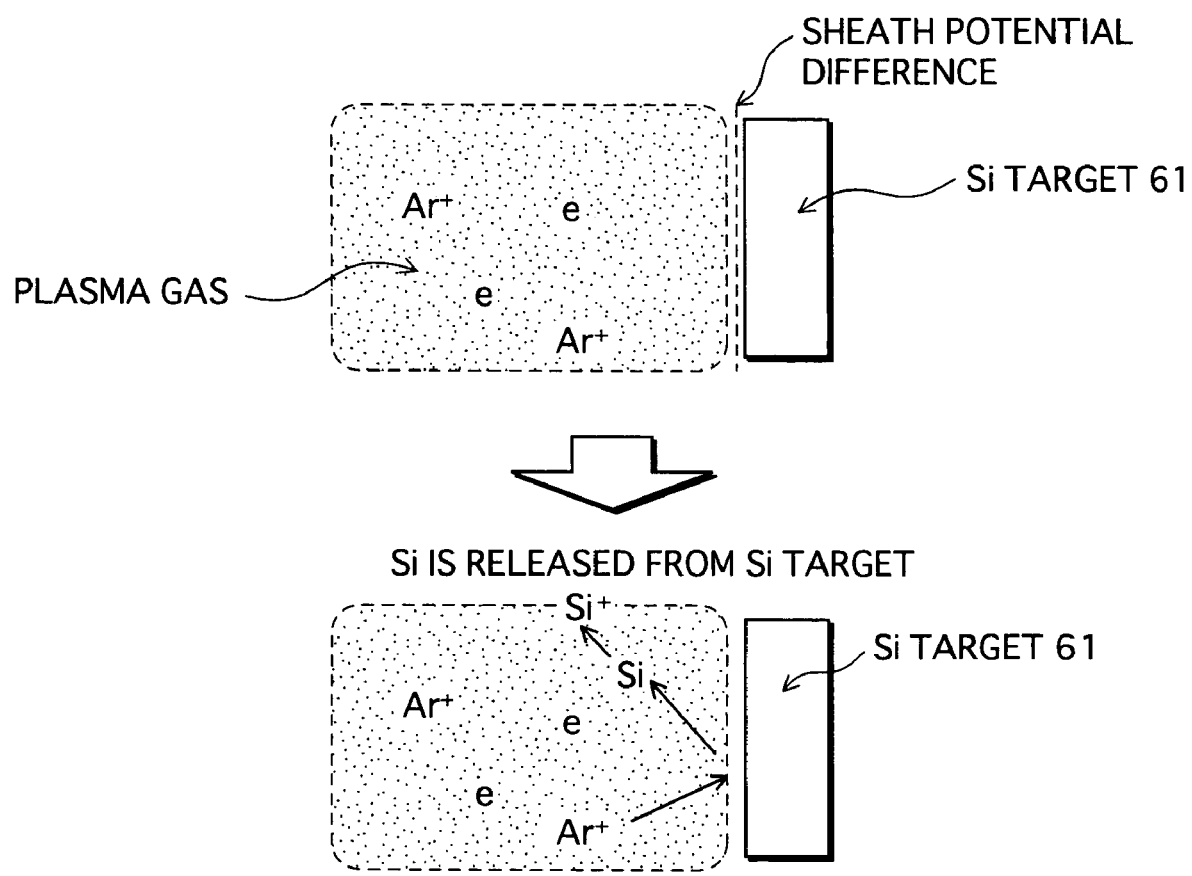
FIG. 20 shows change in state of an area near the target during the plasma cleaning.

FIG. 17 is an external view of a semiconductor laser of a ridge-type stripe structure including a dielectric film that is formed by the above-described plasma cleaning. FIG. 18 is a cross sectional view of the semiconductor laser shown in FIG. 17 taken along the plane X1-X1', which is parallel to an end face of the resonator of the semiconductor laser.

As shown in FIG. 18, the semiconductor laser 180 includes an n-type GaAs substrate 50, an n-type cladding layer 51, an active layer 52, a p-type cladding layer 53, SiNx 54, and a dielectric current blocking layer 55. Also, as shown in FIG. 17, a ridge stripe waveguide being approximately 2 μm in width is formed.

The very thin silicon nitride film 54 formed between the p-type cladding layer 53 and the dielectric current blocking layer 55 reflects laser light of not larger than 800 nm of emission wavelength. This enables laser emissions to have no loss. Also, since the silicon nitride film 54 is insulative, no interface leakage current is generated.

The dielectric current blocking layer 55 is formed after the surface of the p-type cladding layer 53 is cleaned enough. This provides high adhesiveness between the p-type cladding layer 53 and the dielectric current blocking layer 55. The high adhesiveness prevents the dielectric current blocking layer 55 from pealing off even if the semiconductor laser 180 swells and shrinks by a heat that is applied when the semiconductor laser 180 is mounted.

(3) It is desirable that the plasma cleaning is performed in an insulative film mode. The insulative film mode indicates a state in which an insulative material is formed on the surface of the target in the ECR sputtering apparatus, and the yield of the solid subjects sputtered out from the surface of the target is reduced. That is to say, the insulative film mode indicates a state in which a ratio of a film to an object on which the film is formed by the sputtering is reduced.

In the case of the above-described embodiment, the insulative film mode is created if a partial pressure ratio of the nitrogen gas to the argon gas in the first process gas ($N_2$/Ar) is not lower than 0.1, more preferably not lower than 0.2.

When the plasma cleaning is performed on the cleavage planes 31 in the insulative film mode, the amount of silicon sputtered out from the silicon target 61 is reduced. This provides the following advantageous effects: (i) The formation of a silicon film on the cleavage planes 31 is restricted to as small a degree as possible; (ii) The formation of a silicon film on a microwave introduction window is prevented; (iii) Variation of the ECR conditions (plasma discharge conditions) is prevented; and (iv) The number of maintenances of the ECR sputtering apparatus 5 is reduced, which improves the productivity.

Also, if a partial pressure ratio of the nitrogen gas to the argon gas in the first process gas ($N_2$/Ar) is lower than 0.05 (5%), the silicon nitride film formed with the first process gas is not enough in amount to be insulative. Therefore, it is preferable that the partial pressure ratio of the nitrogen gas to the argon gas in the first process gas ($N_2$/Ar) is 5% to 100%, and more preferably, 10% to 30%.

(4) In the above-described embodiment, silicon is used as the target material in the ECR sputtering apparatus 5. However, the target material may be selected from the group consisting of aluminum, titan, zirconium, hafnium, zinc, cerium, tantalum, niobium, and strontium. Also, a gas that reacts with the target material to form an insulating body, such as a non-oxidation gas (a gas containing N such as $NH_3$ and $N_2$) or a hydrogen gas may be used instead of the nitrogen gas.

(5) In the above-described embodiment, a film of SiNx, which is insulative, is formed on the cleavage planes 31. However, a film of a material that reflects light of a certain wavelength maybe formed instead. More particularly, it is preferable that absorption coefficient α of the formed insulating body for laser emission wavelength is not higher than $3 \times 10^4$ cm since this suppresses the influence of the light absorption and is expected to improve the COD level.

(6) In the above-described embodiment, an ECR sputtering apparatus is used to perform the plasma cleaning. However, another apparatus such as an ISM sputtering apparatus that generates helicon wave plasma or inductively-coupled plasma may be used.

(7) The present invention may be applied to manufacturing of low-output semiconductor lasers to improve the COD level and the surge withstanding voltage thereof, as well as to manufacturing of an AlGaInP base, or other material base semiconductor lasers for high output operation.

(8) The present invention is suitable for a method of forming a coating on an end face of a resonator for high-output, high-reliability semiconductor lasers, and is suitable for a method of forming a dielectric film used as a current blocking layer for semiconductor lasers. In addition, the present invention may be applied to manufacturing a device that requires insulation between a film and an object on which the film is formed, such as a surface acoustic wave (SAW) device or a hard disk.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A semiconductor laser manufacturing method for manufacturing a semiconductor laser by cleaning a cleavage plane of a semiconductor laminated structure by a plasma cleaning using a sputtering apparatus, the cleavage plane being to be an end face of a resonator, the method comprising:
   a first step of placing the semiconductor laminated structure with the cleavage plane in the sputtering apparatus;
   a second step of introducing a process gas containing a reactive gas and an inert gas into the sputtering apparatus, and then putting the process gas into a plasma state; and
   a third step of exposing a target material and the cleavage plane to the process gas in the plasma state while no voltage is applied to the target material, causing a reaction of the target material and the reactive gas to form a compound that reflects light of a predetermined wavelength so that a film of the compound is formed on the cleavage plane.

2. The semiconductor laser manufacturing method of claim 1, further comprising:
   a fourth step of, after the third step, putting a second process gas containing an oxygen gas and an inert gas into a plasma state; and
   a fifth step of exposing the target material and the cleavage plane to the second process gas in the plasma state while a voltage is applied to the target material, causing a reaction of the target material and the oxygen gas to form an oxide so that a film of the oxide is formed on the cleavage plane.

3. The semiconductor laser manufacturing method of claim 1, wherein
   the reactive gas is a non-oxidation gas.

4. The semiconductor laser manufacturing method of claim 1, wherein
   the reactive gas is a gas containing either nitrogen or hydrogen.

5. The semiconductor laser manufacturing method of claim 1, wherein
   the compound is insulative.

6. The semiconductor laser manufacturing method of claim 1, wherein
   the predetermined wavelength is a semiconductor laser emission wavelength.

7. The semiconductor laser manufacturing method of claim 1, wherein
   the target material is selected from the group consisting of silicon, aluminum, titanium zirconium, hafnium, zinc, cerium, tantalum, niobium, and strontium.

8. The semiconductor laser manufacturing method of claim 1, wherein
   a partial pressure ratio of the reactive gas to the inert gas in the process gas is 5% to 100%.

9. The semiconductor laser manufacturing method of claim 1, wherein
   a partial pressure ratio of the reactive gas to the inert gas in the process gas is 10% to 30%.

10. The semiconductor laser manufacturing method of claim 1, wherein
    the sputtering apparatus is an ECR sputtering apparatus.

* * * * *